United States Patent
Mulbrook et al.

(10) Patent No.: US 7,675,385 B1
(45) Date of Patent: Mar. 9, 2010

(54) N-WAY RECONFIGURABLE POWER DIVIDER

(75) Inventors: Mark M. Mulbrook, Marion, IA (US); Jonathan P. Doane, Cedar Rapids, IA (US); Jeremiah D. Wolf, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 113 days.

(21) Appl. No.: 12/074,288

(22) Filed: Mar. 3, 2008

(51) Int. Cl.
*H03H 7/38* (2006.01)
*H01P 1/10* (2006.01)
*H01P 5/12* (2006.01)

(52) U.S. Cl. .................................. 333/124; 333/101
(58) Field of Classification Search .................. 333/101, 333/103, 104, 105, 124, 125, 126, 127, 128, 333/177
See application file for complete search history.

(56) References Cited

U.S. PATENT DOCUMENTS 4,893,093 A * 1/1990 Cronauer et al. ............ 330/295
6,323,742 B1 * 11/2001 Ke ............................ 333/127

* cited by examiner

*Primary Examiner*—Dean O Takaoka
(74) *Attorney, Agent, or Firm*—Matthew J. Evans; Daniel M. Barbieri

(57) ABSTRACT

The present disclosure is directed to a method, apparatus, and system for dividing power. An N-way power divider comprises a power input, a switched transformer, a switched power divider, and plurality of power outputs. The switched power divider is configurable to take input power and provide the power to any of the power outputs (matching the impedance utilizing the switched transformer). An antenna system comprises an input, a reconfigurable switched network operably coupled to the input, and a plurality of antenna elements. The reconfigurable switched network is configurable to provide power from input to any of the plurality of antenna elements. Each element can be provided power, or not provided power with the reconfigurable switch. The reconfigurable switched network is configurable to take in power and transform the impedance of the power to match the impedance of the active antenna elements.

14 Claims, 8 Drawing Sheets

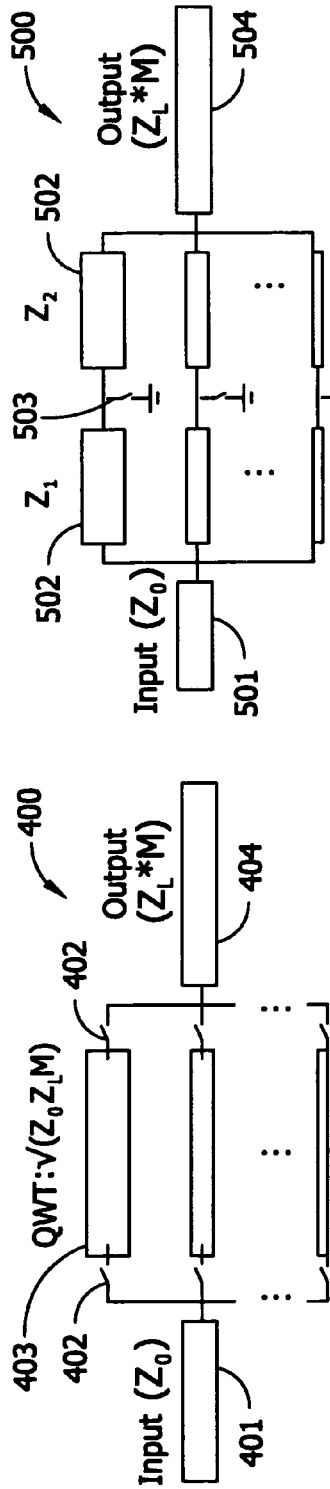
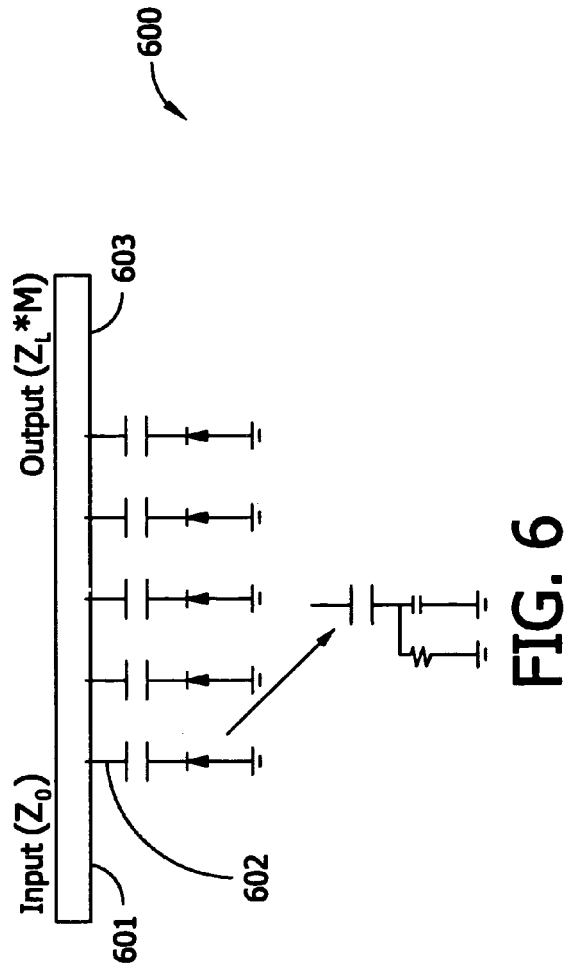
FIG. 5
FIG. 6
FIG. 4

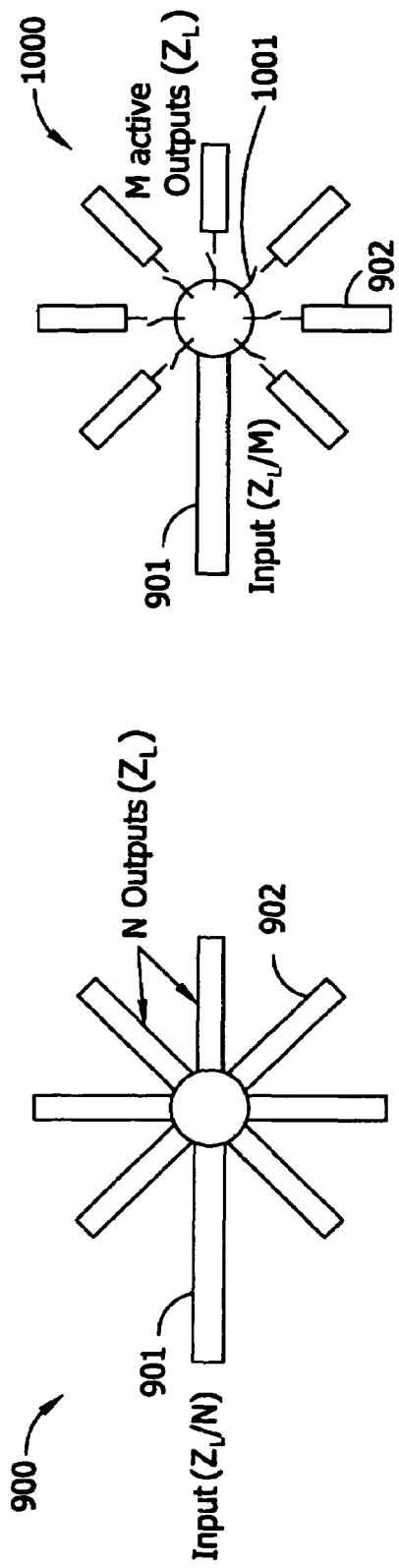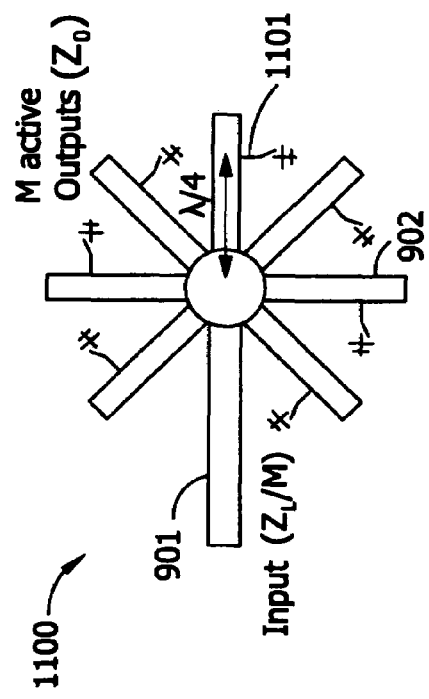
FIG. 10
FIG. 11
FIG. 9

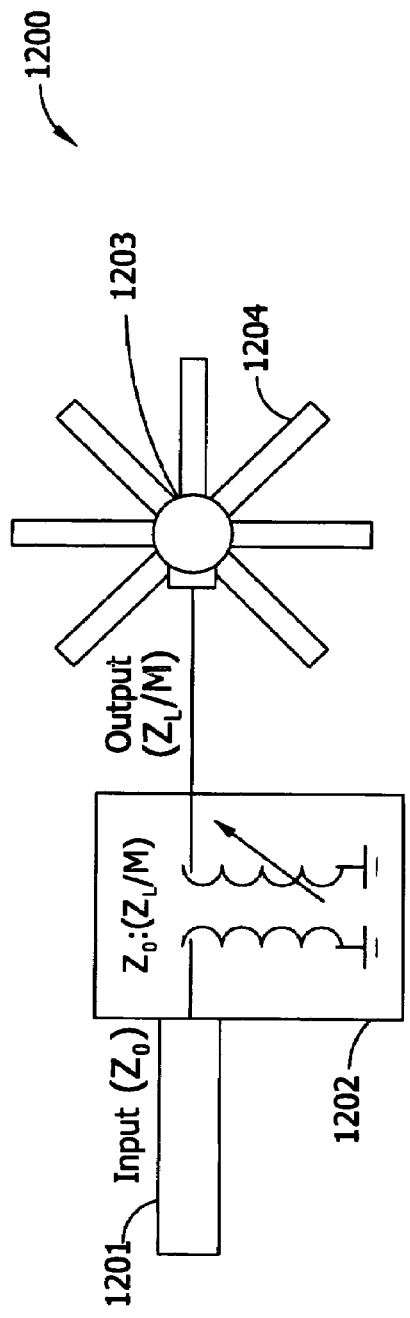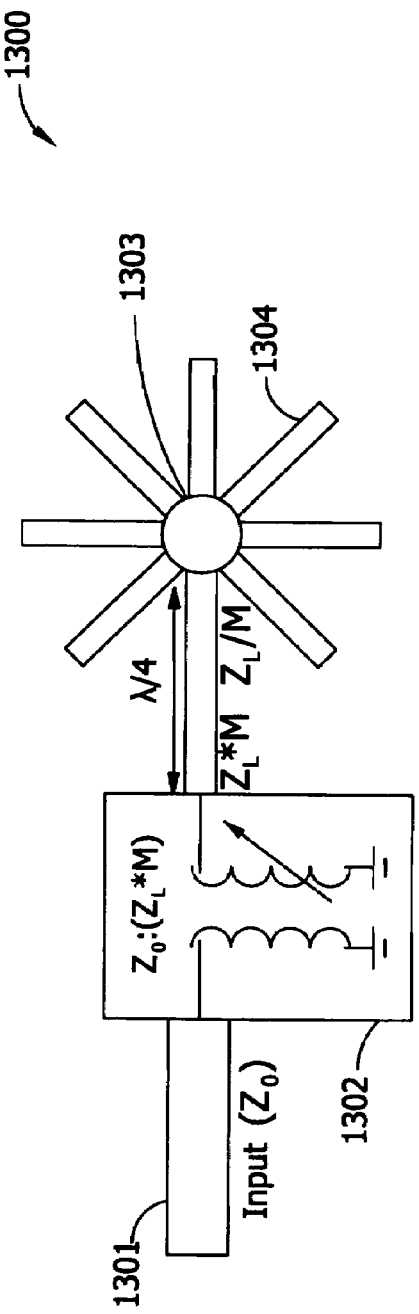
FIG. 12
FIG. 13

N-WAY RECONFIGURABLE POWER DIVIDER

FIELD OF THE INVENTION

The present disclosure relates generally to power and more particularly to a reconfigurable power divider.

BACKGROUND OF THE INVENTION

A power divider is a device that divides an input power among a number of outputs. Power dividers may be utilized in fields such as radio technology and antenna systems.

SUMMARY OF THE INVENTION

The present disclosure is directed to a method, apparatus, and system for dividing power to a variable number of loads while maintaining the impedance match. An N-way power divider may comprise a power input, a switched transformer, a switched power divider, and a plurality of power outputs. The switched power divider may comprise a reactive splitter. The switched power divider may be configured to take in power from the switched transformer and provide the power to any of the plurality of power outputs. The switched power divider may be reconfigured to change the power outputs the switched power divider provides power to. Power outputs may be active when the switched power divider is configured to provide power to those respective power outputs. The switched transformer may be configured to take in power from the power input and transform the impedance of the input transmission line to match the impedance of the combination of the active power outputs. When the switched power divider is reconfigured to change the number of active power outputs, the switched transformer may be reconfigured to transform the impedance of the input transmission line to match the impedance of the new active power outputs. The switched power divider may be configured to provide power from the switched transformer to any of the plurality of power outputs by configuring a plurality of switches. The plurality of switches may comprise a plurality of series switches and/or a plurality of shunt switches and may comprise any switching technology including, but not limited to, PIN (positive intrinsic negative) diode switches or MEMS (microelectromechanical systems) switches based on the needs of the application for which the N-way power divider may be utilized. The switched transformer may comprise a series switched transformer, a shunt switched two segment transformer, or a switched capacitor shunt transformer. The switched transformer may be implemented with many different technical approaches. The switched transformer may comprise wire wound on a core, lumped element capacitors and coils, or matching transmission lines. The configuration of the switched transformer may be achieved with topologies and components that are compatible with the frequency band utilized.

An antenna system may comprise an input, a reconfigurable switched network operably coupled to the input, and a plurality of antenna elements. The reconfigurable switched network may be configurable to provide power from input to any of the plurality of antenna elements. The reconfigurable switched network may be reconfigured to change the antenna elements the reconfigurable switched network provides power to from the input. Antenna elements may be active when the reconfigurable switched network is configured to provide power to those respective antenna elements. The reconfigurable switched network may be configured to take in power from the input and transform the impedance of the power to match the impedance of the active antenna elements. When the reconfigurable switched network is reconfigured to change the active antenna elements, the reconfigurable switched network may be reconfigured to transform the impedance of the power to match the impedance of the new active antenna elements. The reconfigurable switched network may include an N-way power divider. The N-way power divider may include a switched transformer.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figures in which:

FIG. 4 is a diagram illustrating a switched transformer, in accordance with an exemplary embodiment of the present disclosure;

FIG. 5 is a diagram illustrating a switched transformer, in accordance with an alternative embodiment of the present disclosure;

FIG. 6 is a diagram illustrating a switched transformer, in accordance with an alternative embodiment of the present disclosure;

FIG. 9 is a diagram illustrating a switched power divider, in accordance with an exemplary embodiment of the present disclosure;

FIG. 10 is a diagram illustrating a switched power divider, in accordance with an alternative embodiment of the present disclosure;

FIG. 11 is a diagram illustrating a switched power divider, in accordance with an alternative embodiment of the present disclosure;

FIG. 12 is a diagram illustrating an antenna system, in accordance with an exemplary embodiment of the present disclosure;

FIG. 13 is a diagram illustrating an antenna system, in accordance with an alternative embodiment of the present disclosure;

DETAILED DESCRIPTION OF THE INVENTION

Reference will now be made in detail to exemplary embodiments of the disclosure, examples of which are illustrated in the accompanying drawings.

A system may need to dynamically and efficiently route power to a changing number of outputs. One example of such a system may be an antenna system that requires the configuration of an antenna array to change dynamically. Structures utilized by such a system may vary by the amount of hardware utilized to dynamically route power to the changing number of outputs, the amount resulting insertion loss (the decrease in power resulting from the insertion of a device), and the matching between the impedance (resistance of a system to power) of the power and the impedance of the number of outputs. Impedance matching will improve the power transfer and minimize reflections (the portion of power reflected back to the origin rather than being carried to the far end) from a load.

Figure 1:
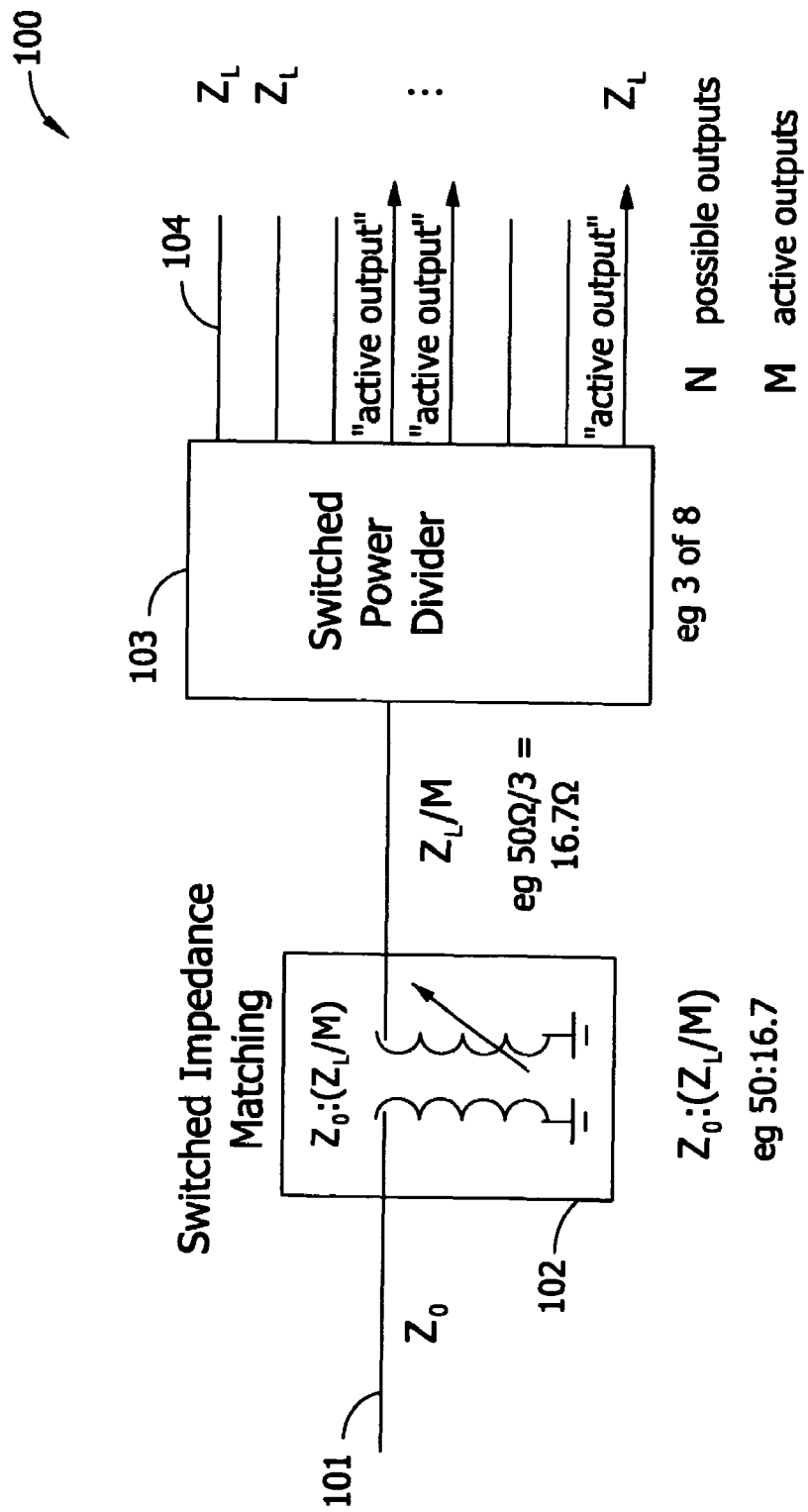
FIG. 1 is a diagram illustrating an N-way power divider, in accordance with an exemplary embodiment of the present disclosure.

Referring generally to FIG. 1, an N-way power divider 100, in accordance with an exemplary embodiment of the present disclosure, is illustrated. The N-way power divider 100 comprises a power input 101, a switched transformer 102 operably coupled to the power input 101, a switched power divider 103 operably coupled to the switched transformer 102, and a plurality of power outputs 104 operably coupled to the switched power divider 103. The switched power divider 103 may comprise a reactive splitter (not shown) operably coupled to the switched transformer 102 and the plurality of power outputs 104. A reactive splitter comprises lines matched to split power evenly to a number of outputs. The switched power divider 103 takes in power from the switched transformer 102 and provides the power to any of the plurality of power outputs 104. The switched power divider 103 may split the power from the switched transformer 102 to provide equal power and/or power of equal phase to any of the plurality of power outputs 104. The switched power divider 103 may be coupled to two or more power outputs 104 and may be configured to provide power from the switched transformer 102 to one of the plurality of power outputs 104, all of the plurality of power outputs 104, or any subset of the plurality of power outputs 104. The switched power divider 103 may be reconfigured to change the power outputs 104 the switched power divider 103 provides power to from the switched transformer 102. Power outputs 104 are active power outputs when the switched power divider 103 is configured to provide power to those respective power outputs 104. Power outputs 104 are inactive power outputs when the switched power divider 103 is not configured to provide power to those respective power outputs 104. The active power outputs 104 may have an impedance. The switched transformer 102 may be configured to take in power from the power input 101 and transform the impedance of the input transmission line to match the impedance of the active power outputs 104. When the switched power divider 103 is reconfigured to change the active power outputs 104, the switched transformer 102 may be reconfigured to transform the impedance of the input transmission line to match the impedance of the new active power outputs 104.

The plurality of power outputs 104 may be operably coupled to the switched power divider 103 by a plurality of switches. The switched power divider 103 may be configured to provide power from the switched transformer 102 to any of the plurality of power outputs 104 by configuring the plurality of switches. In a first state, each switch may allow power to pass from the switched transformer 102 to one of the plurality of power outputs 104. In a second state, each switch may prevent power from passing from the switched transformer 102 to one of the plurality of power outputs 104. The switched power divider 103 may be configured to provide power from the switched transformer 102 to any of the plurality of power outputs 104 by configuring whether the plurality of switches are in the first state or second state. The plurality of switches may comprise a plurality of series switches, where each of the plurality of switches connects one of the plurality of power outputs 104 to the switched power divider 103 in the first state, allowing power to pass to one of the plurality of power outputs 104, and does not connect one of the plurality of power outputs 104 from the switched power divider 103 in the second state, preventing power from passing to one of the plurality of power outputs 104. The plurality of switches may comprise a plurality of shunt switches, where each of the plurality of switches does not connect one of the plurality of power outputs 104 to a ground in the first state, allowing power to pass to one of the plurality of power outputs 104, and does connect one of the plurality of power outputs 104 to a ground in the second state, preventing power from passing to one of the plurality of power outputs 104 because the power is sent to the ground. The plurality of shunt switches may be located a quarter wave away from the switched divider 103 such that power travels a quarter wave between the switched divider 103 and each of the plurality of shunt switches. The plurality of switches may comprise any switching technology including, but not limited to, PIN (positive intrinsic negative) diode switches or MEMS (microelectromechanical systems) switches. The plurality of switches may be implemented utilizing a particular switching technology having a desired characteristic (e.g., speed, power, cost, reliability) based on the needs of the application for which the N-way power divider 100 may be utilized.

Figure 2:
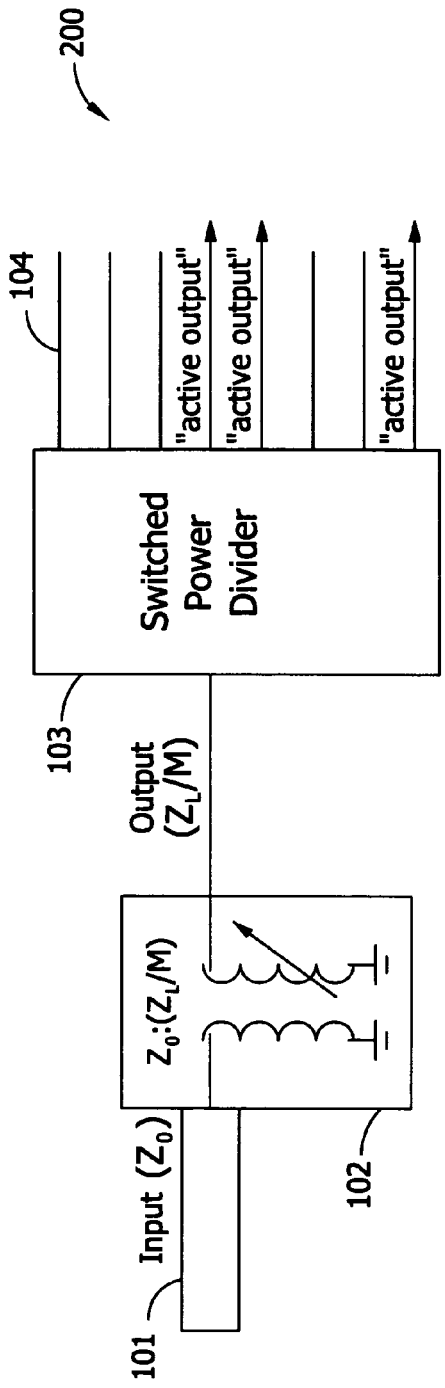
FIG. 2 is a diagram illustrating an N-way power divider, in accordance with an exemplary embodiment of the present disclosure.
Figure 3:
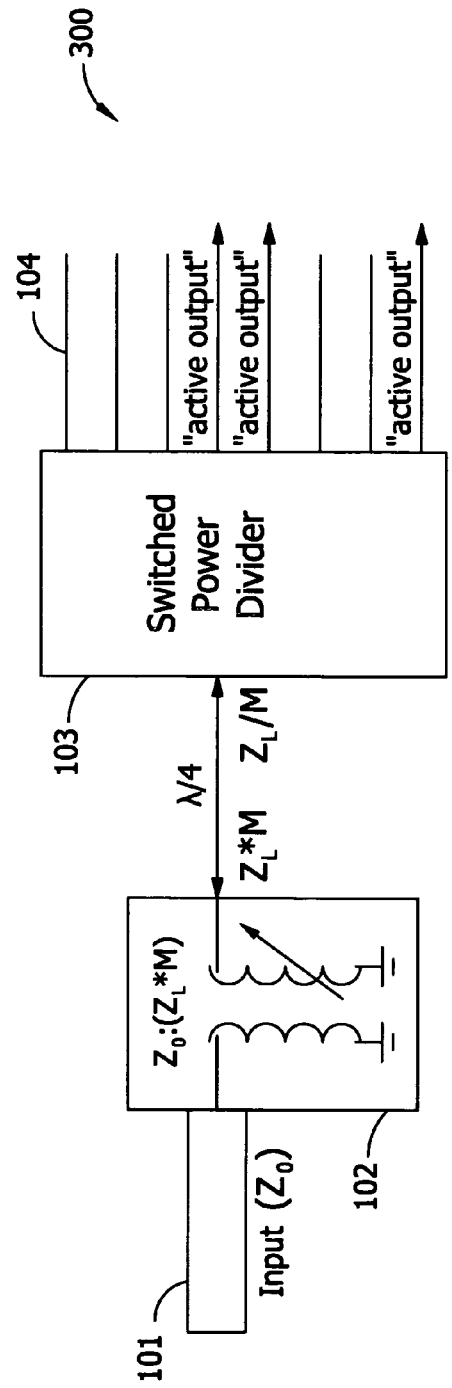
FIG. 3 is a diagram illustrating an N-way power divider, in accordance with an alternative embodiment of the present disclosure.

As illustrated in FIG. 2, the switched transformer 102 may be directly coupled to the switched power divider. Alternatively, as illustrated in FIG. 3, the switched transformer 102 may be coupled a quarter wave away from the switched power divider such that power travels a quarter wave between the switched transformer 102 and the switched power divider 103. The switched transformer 102 may be implemented with many different technical approaches. The switched transformer 102 may comprise wire wound on a core, lumped element capacitors and coils, or matching transmission lines. The configuration of the switched transformer 102 may be achieved with topologies and components that are compatible with the frequency band utilized.

The switched transformer 102 may comprise a series switched transformer 400, as illustrated in FIG. 4. The series switched transformer 400 may comprise a transformer input 401, a first plurality of series switches 402 operably coupled to transformer input 401, a plurality of quarter wave transformers 403 each operably coupled to one of the first plurality of series switches 402, a second plurality of series switches 402 each operably coupled to one of the plurality of quarter wave transformers 403, and a transformer output 404 operably coupled to the second plurality of series switches 402. When one of the first plurality of series switches 402 is in a first state, the transformer input 401 is connected to one of the plurality of quarter wave transformers 403, allowing power to pass from the transformer input 401 to one of the plurality of quarter wave transformers 403 via the respective one of the first plurality of series switches 402. When one of the first plurality of series switches 402 is in a second state, the transformer input 401 is not connected to one of the plurality of quarter wave transformers 403, preventing power from passing from the transformer input 401 to one the plurality of quarter wave transformers 403 via the respective one of the first plurality of series switches 402. When one of the second plurality of series switches 402 is in a first state, one of the plurality of quarter wave transformers 403 is connected to the transformer output 404, allowing power to pass from one of the plurality of quarter wave transformers 403 to the transformer output 404 via the respective one of the second plurality of series switches 402. When one of the second plurality of series switches 402 is in a second state, one of the plurality of quarter wave transformers 403 is not connected to the transformer output 404, preventing power from passing from one of the plurality of quarter wave transformers 403 to the transformer output 404 via the respective one of the second plurality of series switches 402. Thus, the switched transformer 400 may be configured to take in power from the transformer input 401 and transform the impedance of the power by configuring which of the first plurality of series switches 402 and the second plurality of series switches 402 are in the first or second state, configuring which of the plurality of quarter wave transformers 403 is utilized to pass power from the transformer input 401 to the transformer output 404. The first plurality of series switches 402 and the second plurality of series switches 402 may comprise any switching technology including, but not limited to, PIN diode switches or MEMS switches. The first plurality of series switches 402 and the second plurality of series switches 402 may be implemented utilizing a particular switching technology having a desired characteristic (e.g., speed, power, cost, reliability) based on the needs of the application for which the series switched transformer 400 may be utilized.

Alternatively, the switched transformer 102 may comprise a shunt switched two segment transformer 500, as illustrated in FIG. 5. The shunt switched two segment transformer 500 may comprise a transformer input 501, a first plurality of quarter wave transformers 502 operably coupled to the transformer input 501, a plurality of shunt switches 503 each operably coupled to the first plurality of quarter wave transformers 502, a second plurality of quarter wave transformers 502 each operably coupled to one of the plurality of shunt switches 503, and a transformer output 504. When one of the plurality of shunt switches 503 is in a first state, the respective one of the plurality of shunt switches 503 in the first state does not connect to a ground, allowing power to pass between one of the first plurality of quarter wave transformers 502 and one of the second plurality of quarter wave transformers 502. When one of the plurality of shunt switches 503 is in a second state, the respective one of the plurality of shunt switches 503 in the second state connects to a ground, preventing power to pass between one of the first plurality of quarter wave transformers 502 and one of the second plurality of quarter wave transformers 502 because the power is sent to the ground. Thus, the shunt switched two segment transformer 500 may be configured to take in power from transformer input 501 and transform the impedance of the power by configuring which of the plurality of shunt switches 503 are in the first state or second state, configuring which of the first plurality of quarter wave transformers 502 and the second plurality of quarter wave transformers 502 are utilized to pass power from the transformer input 501 to the transformer output 504. The plurality of shunt switches 503 may comprise any switching technology including, but not limited to, PIN diode switches or MEMS switches. The plurality of shunt switches 503 may be implemented utilizing a particular switching technology having a desired characteristic (e.g., speed, power, cost, reliability) based on the needs of the application for which the shunt switched two segment transformer 500 may be utilized.

Alternatively, the switched transformer 102 may comprise a switched capacitor shunt transformer 600, as illustrated in FIG. 6. The switched capacitor shunt transformer 600 may comprise a transformer input 601, a plurality of switched capacitors 602 operably coupled to the transformer input 601, and a transformer output 603 operably coupled to the plurality of switched capacitors 603. When one of the plurality of switched capacitors 602 is in a first state power, flows from transformer input 601 into the respective one of the plurality of switched capacitors 602 in the first state. When one of the plurality of switched capacitors 602 is in a second state, power does not flow from transformer input 601 into the respective one of the plurality of switched capacitors 602. Various transformer ratios may be realized through different numbers of the plurality of switched capacitors 602 being configured in the first or second state. Thus, the switched capacitor shunt transformer 600 may be configured to take in power from transformer input 601 and transform the impedance of the power by configuring which of the plurality of switched capacitors 602 are in the first state or second state, configuring the power passed from the transformer input 601 to the transformer output 603. The plurality of switched capacitors 602 may comprise any switching technology including, but not limited to, PIN diode switches or MEMS switches. The plurality of switched capacitors 602 may be implemented utilizing a particular switching technology having a desired characteristic (e.g., speed, power, cost, reliability) based on the needs of the application for which the switched capacitor shunt transformer 600 may be utilized.

Although the N-way power divider 100 has been described above as splitting input power among any of a plurality of outputs (and matching the impedance of the number of outputs), it should be understood that the N-way power divider 100 may be reciprocal. Rather than power flowing from an input to any of a plurality of outputs, power may flow from a plurality of outputs to an input. Thus, the N-way power divider 100 may also combine power.

Figure 7:
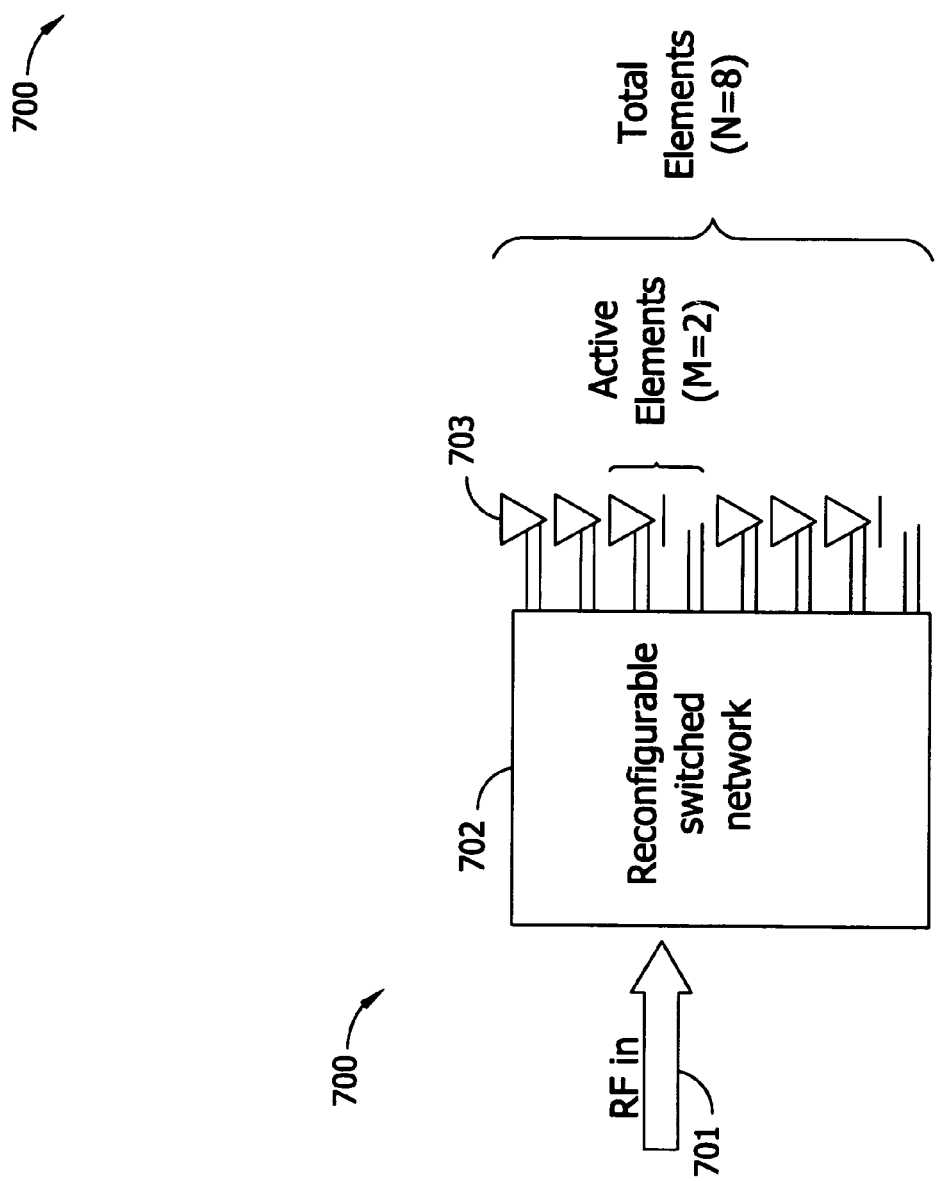
FIG. 7 is a diagram illustrating an antenna system, in accordance with an alternative embodiment of the present disclosure.

FIG. 7 illustrates an antenna system 700, in accordance with an alternative embodiment of the present disclosure. The antenna system 700 comprises an input 701, a reconfigurable switched network 702 operably coupled to the input 701, and a plurality of antenna elements 703 operably coupled to the reconfigurable switched network 702. The reconfigurable switched network 702 is configurable to provide power from input 701 to any of the plurality of antenna elements 703. The reconfigurable switched network 702 may split the power from the input 701 to provide equal power and/or power of equal phase to any of the plurality of antenna elements 703. The reconfigurable switched network 702 may be coupled to two or more antenna elements 703 and may be configured to provide power from the input 701 to one of the plurality of antenna elements 703, all of the plurality of antenna elements 703, or any subset of the plurality of antenna elements 703. The reconfigurable switched network 702 may be reconfigured to change the antenna elements 703 the reconfigurable switched network 702 provides power to from the input 701. Antenna elements 703 are active antenna elements when the reconfigurable switched network 702 is configured to provide power to those respective antenna elements 703. Antenna elements 703 are inactive antenna elements when the reconfigurable switched network 702 is not configured to provide power to those respective antenna elements 703. The number of active antenna elements 703 may have an impedance. The reconfigurable switched network 702 may be configured to take in power from the input 701 and transform the impedance of the power to match the impedance of the active antenna elements 703. When the reconfigurable switched network 702 is reconfigured to change the active antenna elements 703, the reconfigurable switched network 702 may be reconfigured to transform the impedance of the power to match the impedance of the new active antenna elements 703.

Figure 8:
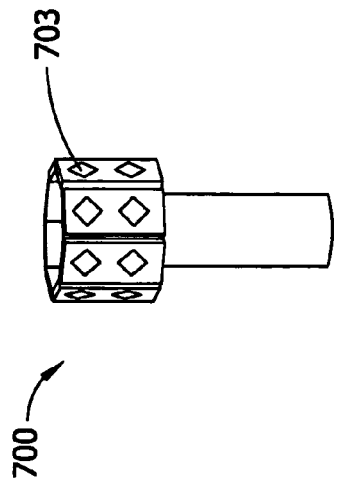
FIG. 8 is a diagram illustrating an antenna system, in accordance with an exemplary embodiment of the present disclosure.

FIG. 8 illustrates an example of an antenna configuration including antenna elements 703 which may be utilized with antenna system 700.

The reconfigurable switched network 702 may include an N-way power divider. As illustrated in FIG. 9, the N-way power divider may include a switched power divider 900. The switched power divider 900 may include an input 901, and a plurality of outputs 902. The plurality of outputs 902 may each be operably coupled to one of antenna elements 703. The switched power divider 900 may be configurable to provide power from input 901 to any of the plurality of outputs 902, such as one of the plurality of outputs 902, a subset of the plurality of outputs 902, or all of the plurality of outputs 902. The switched power divider 900 may comprise a reactive splitter (not shown) operably coupled to the input 901 and the plurality of outputs 902. The switched power divider 900 may comprise a series switched power divider 1000, as illustrated in FIG. 10. The series switched power divider 1000 may comprise a plurality of series switches 1001 each operably coupled to input 901 and one of the plurality of outputs 902. The plurality of series switches 1001 connect the input 901 to one of the plurality of outputs 902 in a first state, allowing power to pass to from the input 901 to one of the plurality of outputs 902, and does not connect input 901 to one of the plurality of outputs 902 in the second state, preventing power from passing from input 901 to one of the plurality of outputs 902. Thus, the series switched power divider 1000 may be configurable to provide power from input 901 to any of the plurality of outputs 902 by configuring the plurality of series switches 1001. The plurality of series switches 1001 may comprise any switching technology including, but not limited to, PIN (positive intrinsic negative) diode switches or MEMS (microelectromechanical systems) switches. The plurality of series switches 1001 may be implemented utilizing a particular switching technology having a desired characteristic (e.g., speed, power, cost, reliability) based on the needs of the application for which the series switched power divider 1000 may be utilized.

Alternatively, the switched power divider 900 may comprise a shunt switched power divider 1100, as illustrated in FIG. 11. The shunt switched power divider 1000 may comprise a plurality of shunt switches 1101 each operably coupled to the input 901 and one of the plurality of outputs 902. The plurality of shunt switches 1101 does not connect one of the plurality of outputs 902 to a ground in the first state, allowing power to pass from the input 901 to the one of the plurality of outputs 902, and does connect one of the plurality of outputs 902 to a ground in the second state, preventing power from passing from input 901 to one of the plurality of outputs 902 because the power is sent to the ground. The plurality of shunt switches 1101 may be located a quarter wave away from the input 901 such that power travels a quarter wave between the input 901 and each of the plurality of shunt switches 1101. Thus, the shunt switched power divider 1100 may be configurable to provide power from input 901 to any of the plurality of outputs 902 by configuring the plurality of shunt switches 1100. The plurality of shunt switches 1101 may comprise any switching technology including, but not limited to, PIN (positive intrinsic negative) diode switches or MEMS (microelectromechanical systems) switches. The plurality of shunt switches 1101 may be implemented utilizing a particular switching technology having a desired characteristic (e.g., speed, power, cost, reliability) based on the needs of the application for which the shunt switched power divider 1100 may be utilized.

The N-way power divider may include a switched transformer coupled to the switched power divider 900. The switched transformer may be configurable to transform the impedance of the power from input 701 to match the impedance of the new active antenna elements 703. As illustrated in FIG. 12, the switched transformer 1202 may be directly coupled to the switched power divider 1203. Alternatively, as illustrated in FIG. 13, the switched transformer 1302 may be coupled a quarter wave away from the switched power divider 1303 such that power travels a quarter wave between the switched transformer 1302 and the switched power divider 1303.

Figure 14:
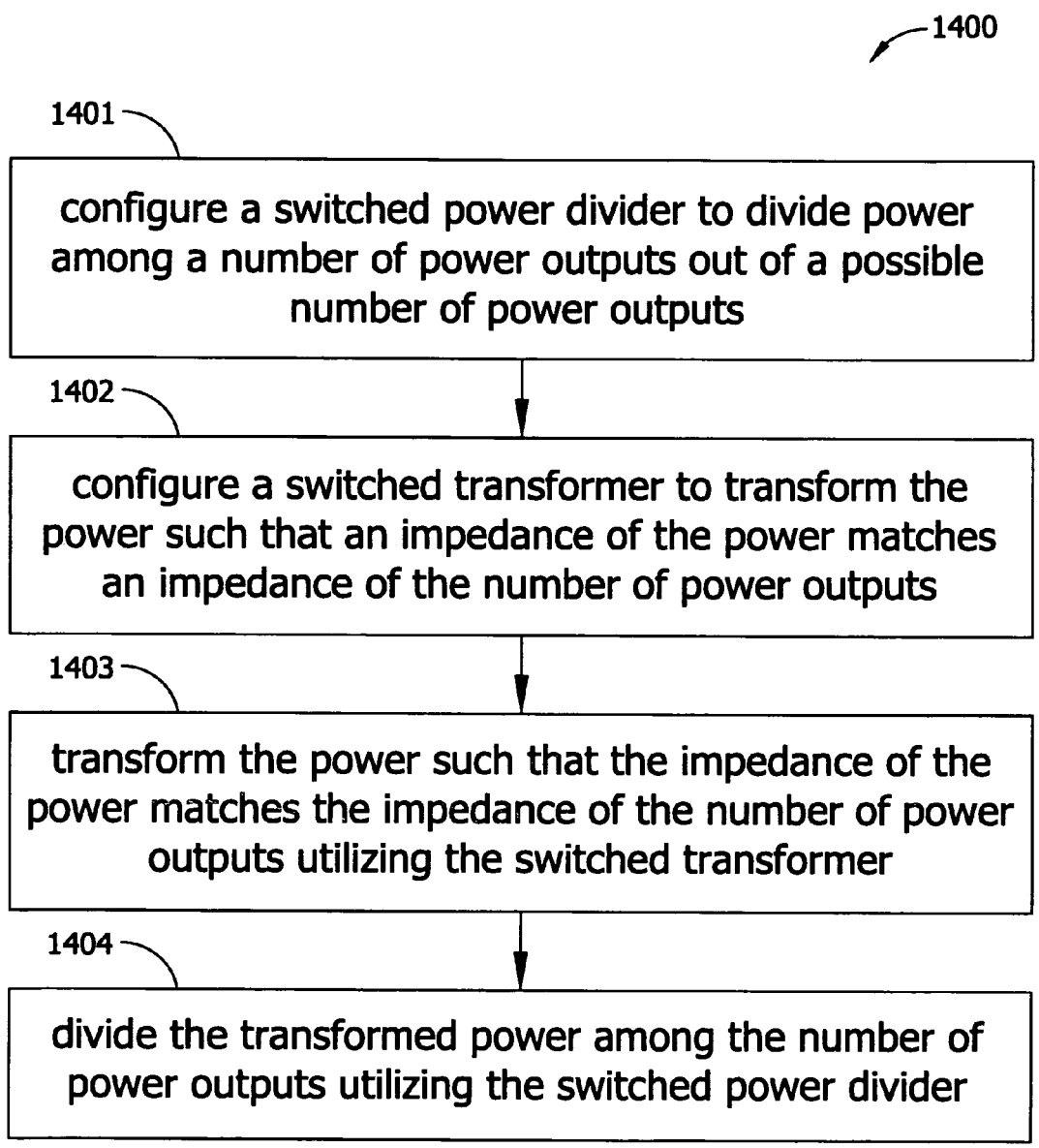
FIG. 14 is a flow chart illustrating a method of dividing power, in accordance with an exemplary embodiment of the present disclosure.

Referring now to FIG. 14, a method 1400 of dividing power, in accordance with an exemplary embodiment of the present disclosure, is shown. In step 1401, configure a switched power divider to divide power among a number of power outputs out of a possible number of power outputs. The number of power outputs out of the possible number of power outputs may comprise one of the possible power outputs, all of the possible power outputs, or any subset of the possible power outputs. In step 1402, configure a switched transformer to transform the power such that an impedance of the power matches an impedance of the number of power outputs. In step 1403, transform the power such that the impedance of the power matches the impedance of the number of power outputs utilizing the switched transformer. In step 1404, divide the transformed power among the number of power outputs utilizing the switched power divider.

Figure 15:
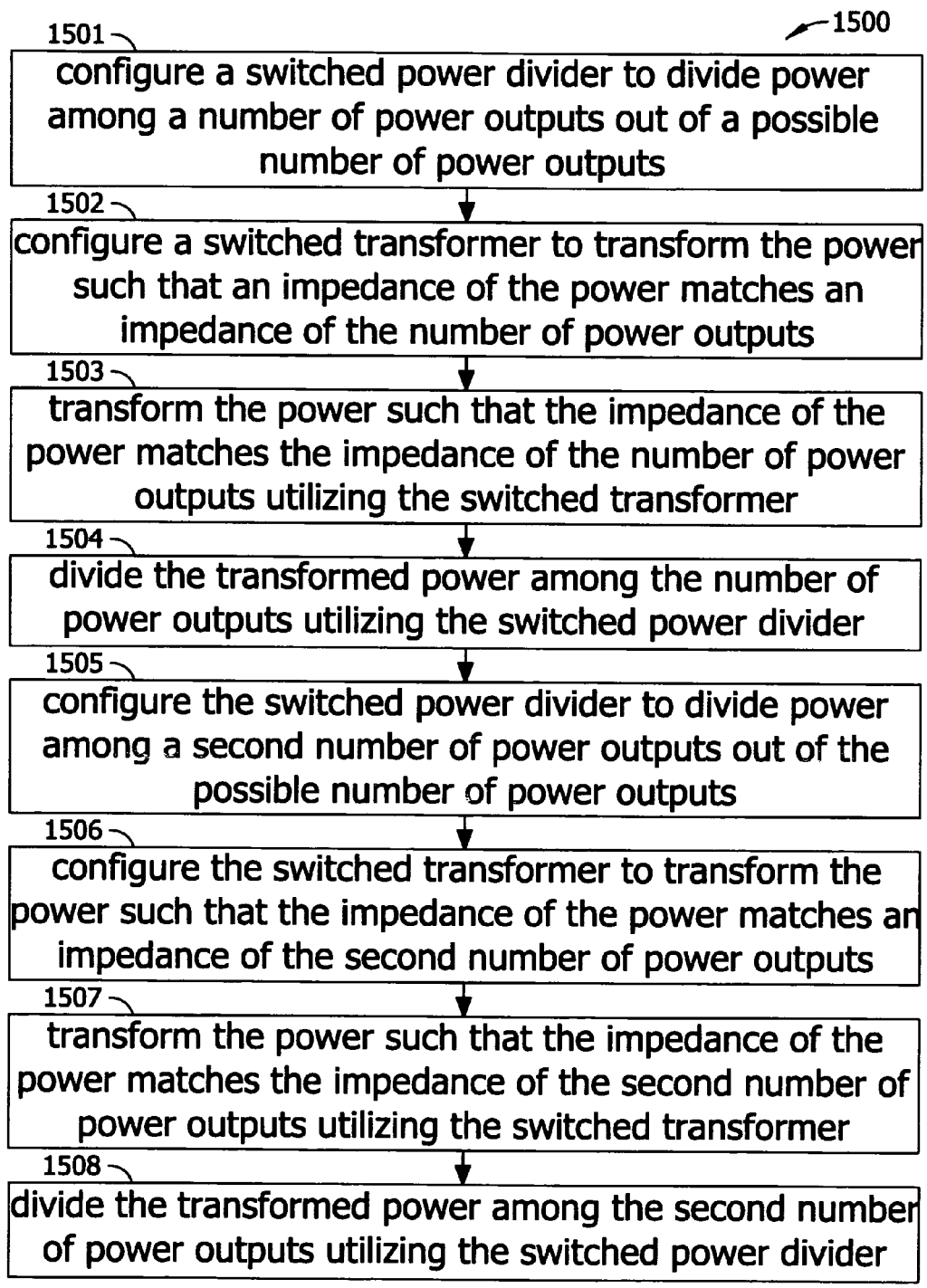
FIG. 15 is a flow chart illustrating a method of dividing power, in accordance with an alternative embodiment of the present disclosure.

Referring now to FIG. 15, a method 1500 of dividing power, in accordance with an exemplary embodiment of the present disclosure, is shown. In step 1501, configure a switched power divider to divide power among a number of power outputs out of a possible number of power outputs. The number of power outputs out of the possible number of power outputs may comprise one of the possible power outputs, all of the possible power outputs, or any subset of the possible power outputs. In step 1502, configure a switched transformer to transform the power such that an impedance of the power matches an impedance of the number of power outputs. In step 1503, transform the power such that the impedance of the power matches the impedance of the number of power outputs utilizing the switched transformer. In step 1504, divide the transformed power among the number of power outputs utilizing the switched power divider. In step 1505, configure the switched power divider to divide power among a second number of power outputs out of the possible number of power outputs. The second number of power outputs out of the possible number of power outputs may comprise one of the possible power outputs, all of the possible power outputs, or any subset of the possible power outputs. In step 1506, configure the switched transformer to transform the power such that the impedance of the power matches an impedance of the second number of power outputs. In step 1507, transform the power such that the impedance of the power matches the impedance of the second number of power outputs utilizing the switched transformer. In step 1508, divide the transformed power among the second number of power outputs utilizing the switched power divider.

It is understood that the present invention is not limited to any underlying implementing technology. The present invention may be implemented utilizing any combination of software and hardware technology. The present invention may be implemented using a variety of technologies without departing from the scope and spirit of the invention or without sacrificing all of its material advantages.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. An N-way power divider, comprising:
    a power input;
    a plurality of power outputs, wherein a number of said plurality of power outputs are active and the number of active power outputs have a power output impedance;
    a switched power divider comprising:
        a divider input; and
        a plurality of divider outputs, each of said plurality of divider outputs coupled to one of said plurality of power outputs;
        wherein said switched power divider is configurable to provide power from said divider input to any number of said plurality of power outputs; and
    a switched transformer including a transformer input coupled to said power input and a transformer output coupled to said divider input, wherein said switched transformer provides power with a power impedance from said power input to said divider input and said switched transformer is configurable to transform the power impedance of the power to the power output impedance of the number of active power outputs;
    wherein each power output of said plurality of power outputs is active when said switched power divider is configured to provide power to the power output from said divider input, the switched transformer further comprises:
    a plurality of switched capacitors coupled to said transformer input and said transformer output, wherein each one of said plurality of switched capacitors is configurable between a first state where power passes from said transformer input into said one of said plurality of switched capacitors and a second state where power does not pass from said transformer input into said one of said plurality of switched capacitors and said switched transformer is configurable to transform the power impedance of the power to the power output impedance of the number of active power outputs by configuring said plurality of said switched capacitors between the first state and the second state.

2. The N-way power divider as claimed in claim 1, wherein said switched power divider further comprises:
    a plurality of divider output switches, each of said plurality of divider output switches coupling one of said plurality of power outputs and one of said plurality of divider outputs, wherein each of said divider output switches is configurable between a first state where power is allowed to pass from said divider output to said power output and a second state where power is prevented from passing from said divider output to said power output and said switched power divider is configurable to provide power from said divider input to said any number of said plurality of power outputs by configuring said plurality of divider output switches between the first state and the second state.

3. The N-way power divider as claimed in claim 2, wherein said divider output switches comprise at least one of series switches or shunt switches.

4. The N-way power divider as claimed in claim 2, wherein said divider output switches comprise at least one of a positive intrinsic negative (PIN) diode switch or a microelectromechanical systems (MEMS) switch.

5. The N-way power divider as claimed in claim 1, wherein said transformer output is coupled to said divider input such that the switched transformer is directly coupled to the switched power divider.

6. The N-way power divider as claimed in claim 1, wherein said transformer output is coupled to said divider input such that the switched transformer is coupled a quarter wave away from the switched power divider.

7. The N-way power divider as claimed in claim 1, wherein the switched transformer further comprises:
    a first plurality of series switches coupled to the transformer input;
    a plurality of quarter wave transformers, each one of the plurality of quarter wave transformers coupled to one of the first plurality of series switches; and
    a second plurality of series switches coupled to the transformer output, each one of the second plurality of series switches coupled to one of the plurality of quarter wave transformers;
wherein each of said first plurality of series switches is configurable between a first state where power is allowed to pass from said transformer input to one of said plurality of quarter wave transformers and a second state where power is prevented from passing from said transformer input to said one of said plurality of quarter wave transformers, each of said second plurality of series switches is configurable between a first state where power is allowed to pass from said one of said plurality of quarter wave transformers to said transformer output and a second state where power is prevented from passing from said one of said plurality of quarter wave transformers to said transformer output, and said switched transformer is configurable to transform the power impedance of the power to the power output impedance of the number of active power outputs by configuring said first plurality of series switches between the first and second state and said second plurality of series switches between the first state and the second state.

8. The N-way power divider as claimed in claim 7, wherein said first plurality of series switches comprise at least one of a positive intrinsic negative (PIN) diode switch or a microelectromechanical systems (MEMS) switch and said first plurality of series switches comprise at least one of a positive intrinsic negative (PIN) diode switch or a microelectromechanical systems (MEMS) switch.

9. The N-way power divider as claimed in claim 1, wherein the switched transformer further comprises:
    a first plurality of quarter wave transformers coupled to said transformer input;
    a plurality of shunt switches; each one of said plurality of shunt switches coupled to one of said first plurality of quarter wave transformers; and a second plurality of quarter wave transformers coupled to said transformer output, each of said second plurality of quarter wave transformers coupled to one of said plurality of shunt switches;

wherein each of said plurality of shunt switches is configurable between a first state where power is allowed to pass from said one of said first plurality of quarter wave transformers to one of said second plurality of quarter wave transformers and a second state where power is prevented from passing from one of said first plurality of quarter wave transformers to said one of said second plurality of quarter wave transformers and said switched transformer is configurable to transform the power impedance of the power to the power output impedance of the number of active power outputs by configuring said plurality of shunt switches between the first state and the second state.

10. The N-way power divider as claimed in claim 9, wherein said plurality of shunt switches comprise at least one of a positive intrinsic negative (PIN) diode switch or a microelectromechanical systems (MEMS) switch.

11. The N-way power divider as claimed in claim 1, wherein said plurality of switched capacitors comprise at least one of a positive intrinsic negative (PIN) diode switch or a microelectromechanical systems (MEMS) switch.

12. The N-way power divider as claimed in claim 1, wherein said switched power divider is configurable to provide power from said divider input equally among said any number of said plurality of power outputs.

13. The N-way power divider as claimed in claim 1, wherein said switched power divider is configurable to provide power to all of said any number of said plurality of power outputs with an equal phase.

14. The N-way power divider as claimed in claim 1, wherein said switched power divider further comprises a reactive splitter coupled to said divider input and said plurality of divider outputs.

* * * * *